US012191300B2

(12) United States Patent
Gauthier, Jr. et al.

(10) Patent No.: US 12,191,300 B2
(45) Date of Patent: Jan. 7, 2025

(54) INTEGRATED CIRCUIT STRUCTURE WITH RESISTIVE SEMICONDUCTOR MATERIAL FOR BACK WELL

(71) Applicant: GlobalFoundries U.S. Inc., Malta, NY (US)

(72) Inventors: Robert J. Gauthier, Jr., Williston, VT (US); Rajendran Krishnasamy, Essex Junction, VT (US); Anupam Dutta, Bangalore (IN); Anindya Nath, Essex Junction, VT (US); Xiangxiang Lu, Essex Junction, VT (US); Satyasuresh Vvss Choppalli, Bangalore (IN); Lin Lin, Houston, TX (US)

(73) Assignee: GlobalFoundries U.S. Inc., Malta, NY (US)

(*) Notice: Subject to any disclaimer, the term of this patent is extended or adjusted under 35 U.S.C. 154(b) by 416 days.

(21) Appl. No.: 17/662,921

(22) Filed: May 11, 2022

(65) Prior Publication Data

US 2023/0369314 A1 Nov. 16, 2023

(51) Int. Cl.
*H01L 27/02* (2006.01)

(52) U.S. Cl.
CPC ...... *H01L 27/0262* (2013.01); *H01L 27/0266* (2013.01)

(58) Field of Classification Search
CPC .......................... H01L 27/0262; H01L 27/0266
USPC ........................................................ 257/173
See application file for complete search history.

(56) References Cited

U.S. PATENT DOCUMENTS

| 6,175,394 | B1 | 1/2001 | Wu et al. |
| 7,632,725 | B2 | 12/2009 | Ker et al. |
| 7,746,611 | B2 | 6/2010 | Hammerschmidt |
| 9,202,760 | B2 | 12/2015 | Domanski |
| 2003/0116777 | A1 | 6/2003 | Yu |
| 2006/0044719 | A1 | 3/2006 | Chen et al. |
| 2010/0001351 | A1* | 1/2010 | Zhang .................. H04B 1/44 257/E27.061 |
| 2011/0042716 | A1* | 2/2011 | Lai .................. H01L 27/0266 257/E29.174 |
| 2013/0242659 | A1* | 9/2013 | Yu .................. H10B 41/41 257/316 |

(Continued)

FOREIGN PATENT DOCUMENTS

| DE | 102006037500 B3 | 4/2008 |
| TW | 200701427 A | 1/2007 |

*Primary Examiner* — Didarul A Mazumder
(74) *Attorney, Agent, or Firm* — Francois Pagette; Hoffman Warnick LLC

(57) ABSTRACT

Embodiments of the disclosure provide an integrated circuit (IC) structure with resistive semiconductor material for a back well. The IC structure may include a semiconductor substrate having a deep well, and a device within a first portion of the deep well. The device includes a first doped semiconductor material coupled to a first contact, and a second doped semiconductor material coupled to a second contact. The deep well couples the first doped semiconductor material to the second doped semiconductor material. A first back well is within a second portion of the deep well. A first resistive semiconductor material is within the deep well and defines a boundary between the first portion of the deep well and the second portion of the deep well.

20 Claims, 6 Drawing Sheets

(56) References Cited

U.S. PATENT DOCUMENTS

| | | | |
|---|---|---|---|
| 2013/0307017 A1* | 11/2013 | Chen | H01L 27/0262 |
| | | | 257/E27.06 |
| 2014/0361367 A1* | 12/2014 | Tseng | H01L 29/1079 |
| | | | 438/289 |
| 2020/0411504 A1 | 12/2020 | Mitra et al. | |
| 2022/0190116 A1* | 6/2022 | Dutta | H01L 29/78 |
| 2022/0246632 A1* | 8/2022 | Shimane | H01L 25/0657 |

* cited by examiner

INTEGRATED CIRCUIT STRUCTURE WITH RESISTIVE SEMICONDUCTOR MATERIAL FOR BACK WELL

BACKGROUND

1. Technical Field

The present disclosure provides an integrated circuit (IC) structure with a resistive semiconductor material for a back well.

2. Background Art

Present technology is at atomic level scaling of certain micro-devices such as logic gates, bipolar transistors, field effect transistors (FETs), and capacitors. Circuit chips with millions of such devices are common. In devices formed at especially small scale, a biasing terminal may control the electrical properties of devices within a circuit chip, e.g., the threshold voltage to control current flow through a transistor, the trigger current for an electrostatic discharge (ESD) device, and/or other properties. In some cases, the size and scale of the biasing terminal itself may pose a risk of reducing such properties (e.g., trigger current, threshold voltage, etc.) to values that are lower than desired.

SUMMARY

The illustrative aspects of the present disclosure are designed to solve the problems herein described and/or other problems not discussed.

Embodiments of the disclosure provide an integrated circuit (IC) structure including: a semiconductor substrate having a deep well; a device within a first portion of the deep well, the device including: a first doped semiconductor material coupled to a first contact; a second doped semiconductor material coupled to a second contact, wherein the deep well couples the first doped semiconductor material to the second doped semiconductor material; a first back well within a second portion of the deep well; and a first resistive semiconductor material within the deep well and interposed between the first portion of the deep well and the second portion of the deep well.

Further embodiments of the disclosure provide an integrated circuit (IC) structure including: a semiconductor substrate having a deep well of a first doping type; a device within a first portion of the deep well, the device including: a first doped semiconductor material coupled to a first contact, and having a second doping type opposite the first doping type; a second doped semiconductor material coupled to a second contact, having the second doping type, wherein the deep well couples the first doped semiconductor material to the second doped semiconductor material; a first back well within a second portion of the deep well, and having the first doping type; and a first resistive semiconductor material within the deep well and interposed between the first portion of the deep well and the second portion of the deep well.

Additional embodiments of the disclosure provide an integrated circuit (IC) structure including: a semiconductor substrate having a deep well of a first doping type; a shallow well within the deep well, the shallow well having a second doping type opposite the first doping type; a device within a first portion of the deep well and within the shallow well, the device including: a first doped semiconductor material within the first portion of the deep well, coupled to a first contact, and having the second doping type; a second doped semiconductor material within the shallow well, coupled to a second contact, having the first doping type, wherein the deep well couples the first doped semiconductor material to the second doped semiconductor material; a back well within a second portion of the deep well, and having the first doping type; and a resistive semiconductor material within the deep well and interposed between the first portion of the deep well and the second portion of the deep well.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which.

Figure 1:
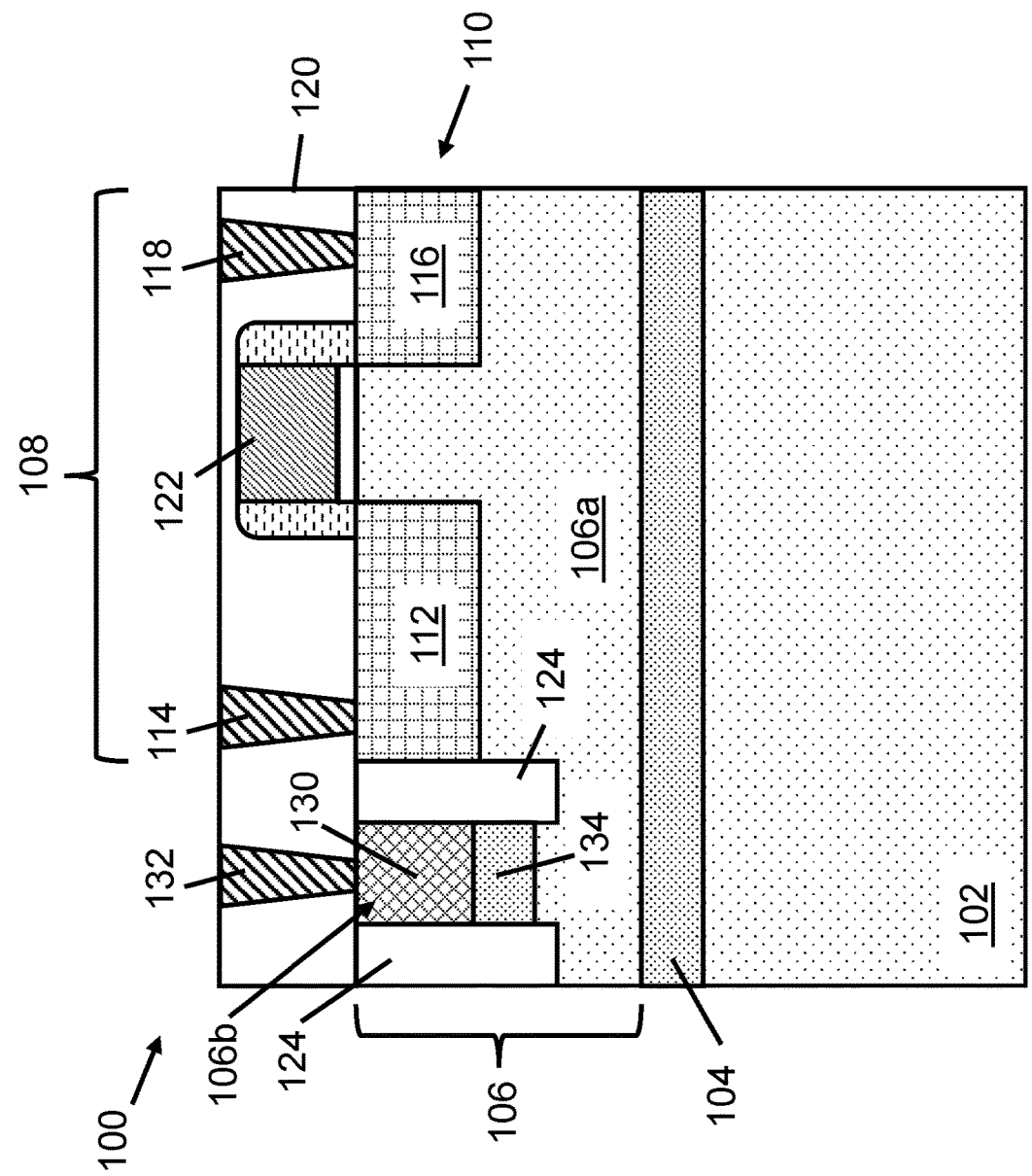
FIG. 1 depicts a cross-sectional view of an IC structure and back well with a resistive semiconductor material according to embodiments of the disclosure.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description but is not intended to be exhaustive or limited to the disclosure in the form disclosed. Many modifications and variations will be apparent to those of ordinary skill in the art without departing from the scope and spirit of the disclosure. The embodiment was chosen and described to best explain the principles of the disclosure and the practical application, and to enable others of ordinary skill in the art to understand the disclosure for various embodiments with various modifications as are suited to the particular use contemplated.

Embodiments of the disclosure provide an integrated circuit (IC) structure with a resistive semiconductor material for a back well. The IC structure may include a semiconductor substrate having a deep well of a particular doping type (e.g., p-type or n-type). A device may be at least partially within a first portion of the deep well. A first doped semiconductor material of the device is coupled to a first contact, and a second doped semiconductor material of the device is coupled to a second contact. The two doped semiconductor materials may be defined within doped semiconductor regions (e.g., varyingly doped semiconductor materials) within the deep well. At least one back well is within a second portion of the deep well, and hence distinct from any doped portions of the device structure. The biasing structure may be electrically coupled to the first doped semiconductor material through the deep well, e.g., to enable biasing of the device through the deep well. To lessen the effect of such biasing on the device, a resistive semiconductor material may be within the deep well to define a boundary between portions of the deep well coupled to the back well, and portions of the deep well coupled to the device. In this arrangement, charge carrier pathways from the back well to the device will include the resistive semiconductor material.

Referring to FIG. 1, an integrated circuit (IC) structure (simply "structure" hereafter) 100, according to embodiments of the disclosure, is shown. Structure 100 is formed on a substrate 102 including, e.g., one or more semiconductor materials. Substrate 102 may include but is not limited to silicon, germanium, silicon germanium (SiGe), silicon carbide, or any other common integrated circuit (IC) semiconductor substrates. In the case of SiGe, the germanium concentration in substrate 102 may differ from other SiGe-based structures described herein. A portion or entirety of substrate 102 may be strained.

Various components (e.g., various doped wells, doped semiconductor materials, trench isolation regions, etc.) may be formed above a resistive region 104 on substrate 102. Resistive region 104 may be formed on or within substrate 102, e.g., by converting a portion of semiconductor material within substrate 102 into a higher-resistive material such as amorphous semiconductor (e.g., a-Si) or polycrystalline semiconductor (e.g., poly-Si). Resistive region 104 may extend horizontally throughout substrate 102, and/or may be formed selectively under locations where doped materials are formed, examples of which are discussed elsewhere herein. In further implementations, resistive region 104 may include oxygen doping to form a dielectric insulator or a buried oxide ("BOX") layer on substrate 102 to electrically isolate overlying doped semiconductor materials. In further implementations, resistive region 104 may include other implanted elements or molecules such as Ge, N, or Si. However embodied, resistive region 104 may be sized as narrow as possible to provide better interaction with overlying semiconductor materials, and in various embodiments may have a thickness that is at most approximately twenty-five nanometers (nm) to approximately five-hundred nm. Some portions of substrate 102 may not have resistive region 104, and/or multiple resistive regions 104 may be formed within substrate 102 at different positions.

Various conductive particles ("dopants") may be introduced into semiconductor material(s) of substrate 102 above resistive region 104, e.g., to define a deep well 106 therein. A "dopant" refers to an element introduced into semiconductor to establish either p-type (acceptors) or n-type (donors) conductivity. In the case of a silicon substrate, common dopants may include, e.g., boron (B), and/or indium (In), for p-type doping. For n-type doping, the doped element(s) may include, for example, phosphorous (P) arsenic (As), and/or antimony (Sb). Doping is the process of introducing impurities (dopants) into the semiconductor substrate, or elements formed on the semiconductor substrate, and is often performed with a mask (e.g., a film of photoresist material and/or other component to block dopants) in place so that only certain areas of the substrate will be doped. In the example of doping by implantation, an ion implanter may be employed. In further examples, in-situ doping or other doping techniques may be used.

In doping processes, a doping type, a dopant species, a dosage, and an energy level are specified and/or a resulting doping level may be specified. A dosage may be specified in the number of atoms per square centimeter ($cm^2$) and an energy level (specified in keV, kilo-electron-volts), resulting in a doping level (concentration in the substrate) of a number of atoms per cubic centimeter ($cm^3$). The number of atoms is commonly specified in exponential notation, where a number like "3E15" means 3 times 10 to the 15th power, or a "3" followed by 15 zeroes (3,000,000,000,000,000). An example of doping is implanting with B (boron) with a dosage of between about 1E12 and 1E13 atoms/$cm^2$, and an energy of about 40 to 80 keV to produce a doping level of between 1E17 and 1E18 atoms/$cm^3$.

Doped portions of a substrate may be known in the art as a "well." A well commonly refers to the implanted/diffused region in semiconductor wafer needed to implement a complementary metal oxide semiconductor (CMOS) cell. A "deep well" refers to doped semiconductor material located underneath active device components and/or other wells. A "shallow well," similar to a deep well, is an area of doped semiconductor material located beneath active device components but not to the same depth as a deep well. Hence, it is possible for a highly doped active semiconductor material to be located inside of a shallow well or deep well, and/or for the shallow well in turn to be located inside of a deep well. Additional levels of wells may be provided in further device structures, e.g., to produce a "triple well" stack of doped semiconductor materials and/or more complex arrangements of layers having distinct doping polarities and/or types. Depending on the attributes of a device to be manufactured, portions of semiconductor material on or over substrate 102 may be either n-type or p-type doped as discussed herein.

Various semiconductor materials above resistive region 104 may be doped, based on the intended polarity and/or intended characteristics of device structures formed thereon. For example, deep well 106 may have a predetermined polarity (e.g., p-type doping). Deep well 106 initially may be formed within an entire thickness of substrate 102 over resistive region 104, but this is not necessarily required. Additional doped material(s) and/or structures may be formed within various portions of deep well 106, to define electrical pathways within an electrical circuit. Other materials may be formed to electrically bias and/or influence current flow through deep well 106, and additional doped regions therein, without fundamentally changing the function of doped elements and/or affecting other structures. Where resistive region 104 is present, a remainder of semiconductor material below resistive region 104 may define substrate 102.

Structure 100 may include a device 108 formed within a portion of deep well 106, which in a first example may include a transistor 110. Regardless of the structure(s) of the particular device 108 and its operation in structure 100, device 108 may include a first doped semiconductor material 112 coupled to a first contact 114 and a second doped semiconductor material 116 coupled to a second contact 118. Deep well 106 may be located between doped semiconductor materials 112, 116 such that electrical pathway from first contact 114 to second contact 118 or vice versa includes at least a portion of deep well 106. Each doped semiconductor material 112, 116 may include a doped semiconductor material having a doping type other than that of deep well 106. For instance, doped semiconductor materials 112, 116 may be doped n-type in the case where deep well 106 is doped p-type.

One or more of contacts 114, 118 to overlying circuit elements may be formed within predetermined portions of an insulator layer 120 by a controlled amount of vertical etching to form openings to one or more contact sites, and then filling the openings with a conductor. Each contact 114, 118 may include any currently known or later developed conductive material configured for use in an electrical contact, e.g., copper (Cu), aluminum (Al), etc. Contacts 114, 118 may additionally include refractory metal liners (not shown) positioned alongside insulator layer 120 to prevent electromigration degradation, shorting to other components, etc. Additionally, selected portions of doped semiconductor materials 112, 116 may include silicide regions (i.e., portions of semiconductor that are annealed in the presence of an overlying conductor to increase the electrical conductivity of semiconductor regions) to increase the electrical conductivity at their physical interface with contact(s) 114, 118 where applicable.

Device 108 in one example may include transistor 110 in the form of, e.g., a metal oxide semiconductor field effect transistor (MOSFET). In this case, transistor 110 also may include a gate structure 122 over deep well 106 and horizontally between doped semiconductor materials 112, 116. Electrical contacts (not shown) to gate structure 122 may be formed through insulator layer 120 in a manner similar to contacts 114, 118, but in a cross-section other than the one shown in FIG. 1. Gate structure 122 may include multiple subcomponents, e.g., a high dielectric constant ("high-k," indicating a k value of at least approximately 3.9) dielectric layer on deep well 106, a gate metal thereon, and sidewall spacers adjacent the dielectric layer and gate metal. Such subcomponents of gate structure 122 are generally well understood in the art and thus not discussed in further detail herein. Where device 108 includes transistor 110, first doped semiconductor material 112 may define a source or drain region ("S/D region") whereas second doped semiconductor material 116 may define another S/D region. In this case, applying at least a predetermined voltage (i.e., "threshold voltage") to conductive portions of gate structure 122 controls whether current may pass from first doped semiconductor material 112 to second doped semiconductor material 116 through deep well 106.

Embodiments of the disclosure include various elements to affect electrical biasing of device 108 through deep well 106. To isolate such elements physically and electrically from doped components of device 108, structure 100 may include one or more trench isolation (TI) regions 124. TI(s) 124 may be formed by forming trenches (not shown) within deep well 106 of substrate 102 and filling such trenches with an insulating material such as oxide, to isolate various materials within deep well 106 from another. TI(s) 124 may have the same insulative material(s) used in insulator layer 120 or different insulating materials (e.g., various oxide and/or nitride insulators). Hence, TI(s) 124 may electrically isolate device 108 from any material(s) for electrically biasing device 108, e.g., to influence the threshold voltage of transistor 110 and/or other electrical properties. According to one example, two TIs 124 are formed, but more or fewer TIs 124 may be formed in various embodiments discussed herein.

The portions of deep well 106 in which device 108 is formed may partially define a first portion 106a of deep well 106. In this case, embodiments of structure 100 may include a back well 130 within a second portion 106b of deep well 106. Back well 130 may have the same doping type as deep well 106 (e.g., p-type doping) but in a higher doping concentration. The higher doping concentration of back well 130 as compared to deep well 106 may enable stronger electrical coupling to a back contact 132 within insulator layer 120.

Structure 100 may include a resistive semiconductor material 134 within deep well 106 and adjacent back well 130. Resistive semiconductor material 134 may include one or more semiconductor materials of higher resistivity than other semiconductor materials within deep well 106, e.g., a-Si, poly-Si, and/or other materials of higher resistance than the material(s) within deep well 106. In an example configuration shown in FIG. 1, an upper surface of resistive semiconductor material 134 may border a lower surface of back well 130, and resistive semiconductor material 134 may be horizontally adjacent TI(s) 124. Here, resistive semiconductor material 134 may define a physical boundary between first portion 106a and second portion 106b of deep well 106. That is, first portion 106a and second portion 106b of deep well 106 are electrically connected through resistive semiconductor material 134, and no other pathways for charge carriers between first portion 106a and second portion 106b are present (e.g., due to the position of TI(s) 124). It has been determined that including resistive semiconductor material 134 as a boundary between second portion 106b/back well 130 and first portion 106a below device 108 may reduce the effects of electrical biasing on device 108 (e.g., it lessens reduction in threshold voltage in the case of transistor 110). Moreover, resistive semiconductor material 134 can be formed below back well 130 and adjacent TI(s) 124 without affecting the surface area needed to form device 108 and back well 130.

Figure 2:
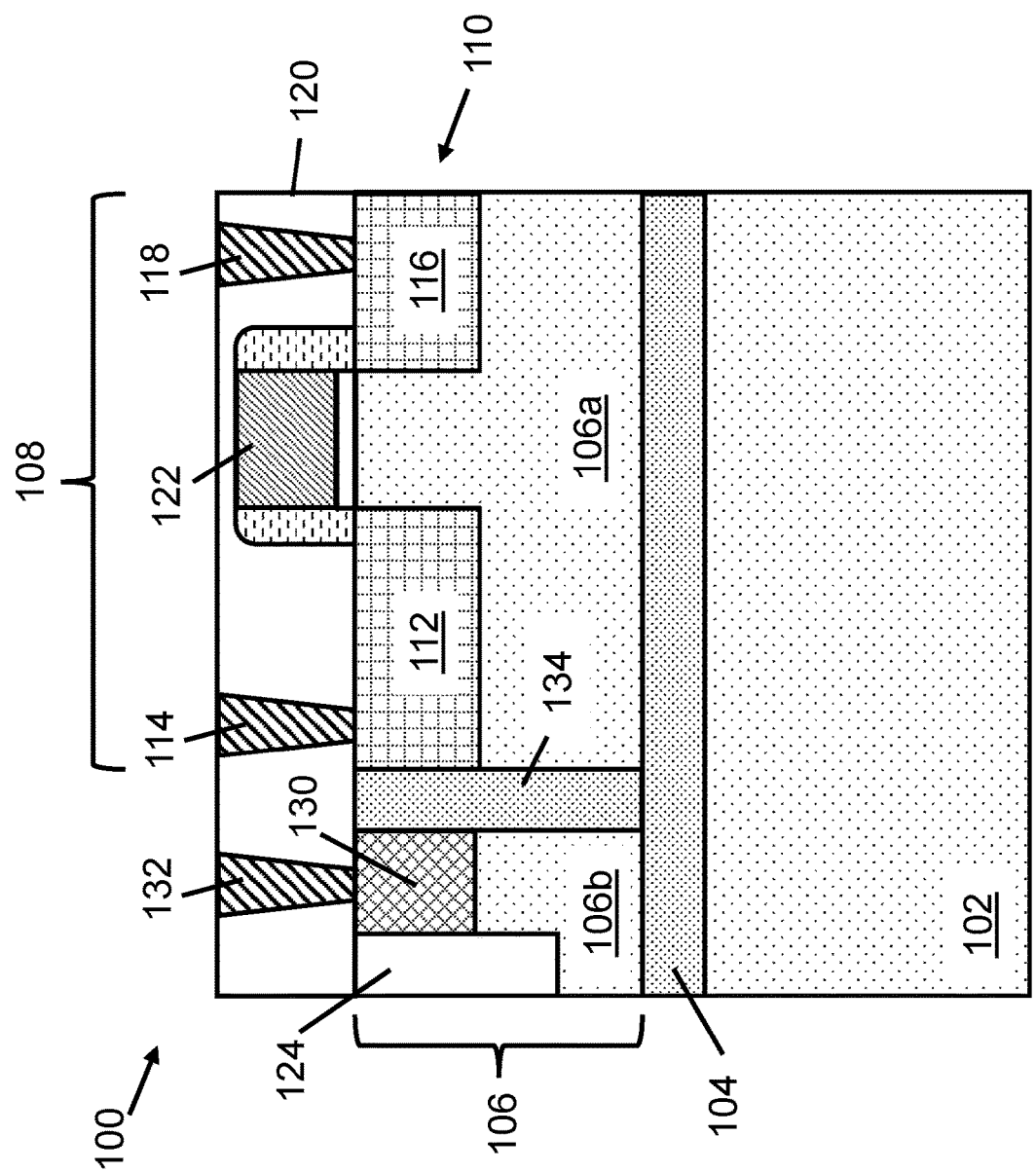
FIG. 2 depicts a cross-sectional view of an IC structure and back well with a vertically extending resistive semiconductor material according to further embodiments of the disclosure.

FIG. 2 depicts a further embodiment of structure 100 in which resistive semiconductor material 134 may be shaped differently without significantly affecting the electrical performance of device 108 and/or back well 130. According to a further example, resistive semiconductor material 134 may be positioned horizontally between back well 130 and first doped semiconductor material 112 of device 108. Hence, one TI 124 may be omitted from structure 100 in this implementation. A lower portion of resistive semiconductor material 134 may horizontally separate first portion 106a and second portion 106b of deep well 106 from each other. An upper portion of resistive semiconductor material 134 may horizontally separate first doped semiconductor material 112 from back well 130.

Positioning of resistive semiconductor material 134 horizontally between first doped semiconductor material 112 and back well 130 may reduce the moderating effects of resistive semiconductor material 134 on back well 130. Such moderating effects include bias-induced reduction in threshold voltage or other electrical properties, such as trigger current, discussed herein. Resistive semiconductor material 134, in this case, continues to define a continuous boundary between portions 106a, 106b of deep well 106. In this configuration, resistive semiconductor material 134 may be located over resistive region 104. Optionally, resistive region 104 and resistive semiconductor material 134 may define horizontally extending and vertically extending portions, respectively, of a single resistive region in the case that resistive region 104 and resistive semiconductor material 134 have a same material composition.

Figure 3:
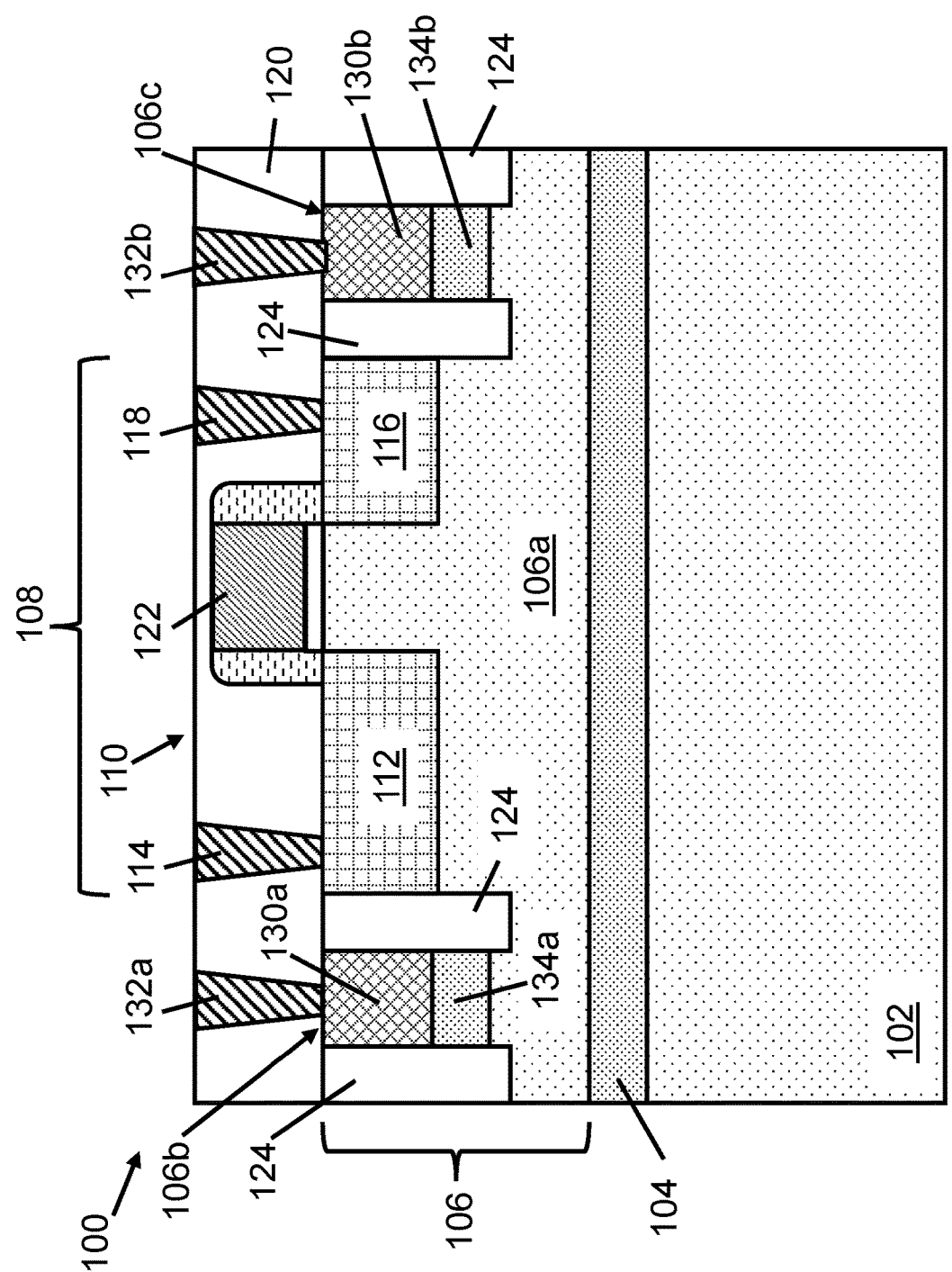
FIG. 3 depicts a cross-sectional view an IC structure with multiple back wells according to embodiments of the disclosure.

FIG. 3 depicts a further example of structure 100, e.g., to increase the effect of electrical biasing on device 108. In some cases, it may be desirable to include multiple back wells 130 in deep well 106. Embodiments of structure 100 thus may include a first back well 130*a* and a second back well 130*b*, each separated from first portion 106*a* of deep well 106 through respective resistive semiconductor materials 134*a*, 134*b*. Back wells 130*a*, 130*b* similarly may each have a respective back contact 132*a*, 132*b* formed thereto. Second back well 130*b* thus may be within a third portion 106*c* of deep well 106, such that resistive semiconductor material 134*b* defines a boundary between first portion 106*a* and third portion 106*c* of deep well 106. Voltages may be applied to one or more back wells 130*a*, 130*b* to control aspects of device 108 (e.g., threshold voltage or other properties such as trigger current, discussed herein) by larger or smaller degrees. Although back wells 130*a*, 130*b* and portions 106*b*, 106*c* of doped well are shown by example to be on opposite horizontal ends of device 108, this is not necessarily required in all implementations.

Figure 4:
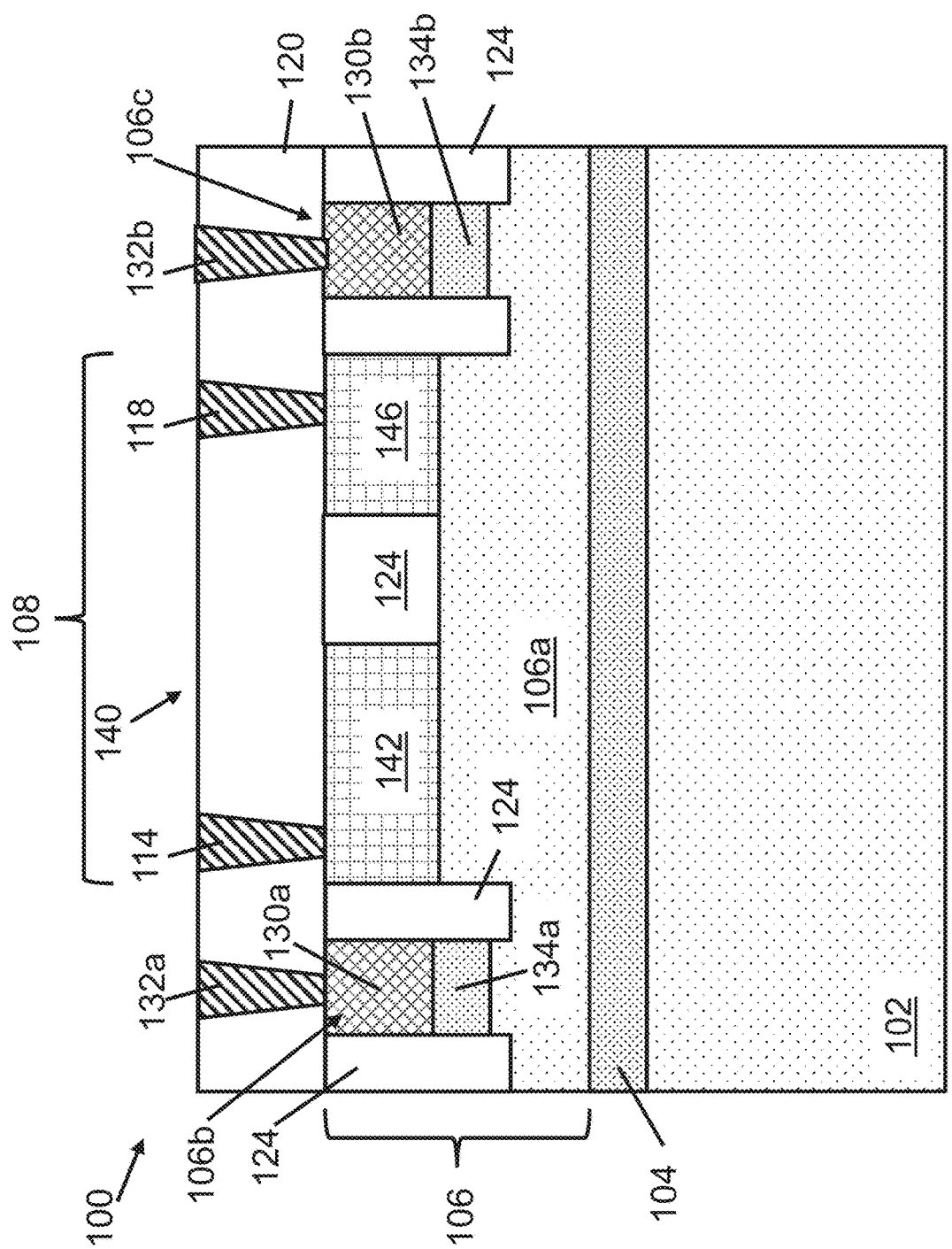
FIG. 4 depicts a cross-sectional view of an IC structure with an electrostatic discharge (ESD) device according to embodiments of the disclosure.

FIG. 4 depicts a further example of structure 100 in which device 108 is implemented as an electrostatic discharge device (ESD) 140, rather than transistor 110 (FIGS. 1-3). ESD device 140 is a circuit structure for controlling an electrostatic discharge event in which ESD device 140 becomes electrically doped only in response to an electrostatic discharge, thereby routing discharge currents in parallel with other circuit components. ESD device 140 may include a set of alternatingly doped regions, e.g., to form a set of n-p-n doped semiconductor regions. Here, ESD device 140 may include a first doped semiconductor region 142 (e.g., a first n-type doped semiconductor) within deep well 106 and coupled to a first contact 114. ESD device 140 also includes a second doped semiconductor region 146 (e.g., a second n-type doped semiconductor) coupled to second contact 118. One or more TI(s) 124, and/or other insulative materials such as nitride, may be horizontally between first doped semiconductor region 142 and second doped semiconductor region 146 to define an electrical pathway through deep well 106. In this configuration, deep well 106 may be doped p-type, such that first doped semiconductor region 142, deep well 106, and second doped semiconductor region 146 together define an n-p-n junction between contacts 114, 118.

An electrostatic discharge event may induce a current flow from first contact 114 to second contact 118, e.g., when a predetermined trigger current to first contact 114 is met or exceeded. By adjusting the voltage applied to back well(s) 130*a*, 130*b*, it is possible to modulate the total amount of current required to trigger the ESD device 140 ("$I_{trigger}$"). The presence of resistive semiconductor material(s) 134*a*, 134*b* may reduce the sensitivity of ESD device 140 to any biasing voltages applied to back well(s) 130*a*, 130*b*. Thus, the circuit can be electrically configured with a higher or lower $I_{trigger}$ value depending on intended operation to avoid a mis-triggering of ESD device 140. As with other implementations discussed herein, the number and/or position of back wells 130 may be different based on the likelihood of an electrostatic discharge event. Moreover, one or more back wells 130 having vertically extending resistive semiconductor material(s) 134 may be used with and/or in place of one or more TI(s) 124, e.g., in a configuration similar to FIG. 2 and discussed elsewhere herein.

Figure 5:
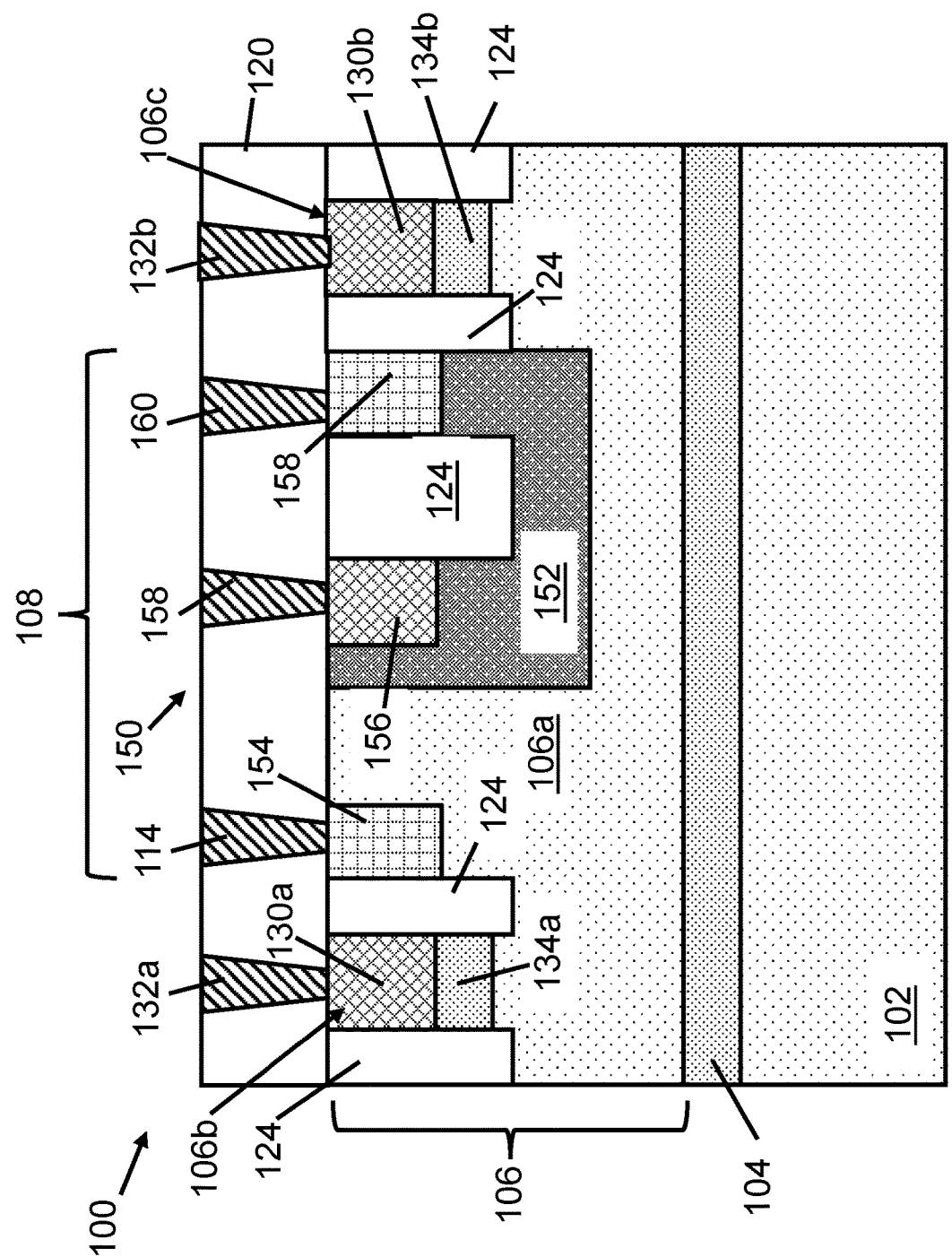
FIG. 5 depicts a cross-sectional view of an IC structure with a silicon controlled rectifier (SCR) according to embodiments of the disclosure

FIG. 5 depicts yet another configuration of structure 100 in which device 108 includes a particular type of ESD device known as a silicon controlled rectifier (SCR) 150. SCR 150 may operate on principles similar to ESD device(s) 140 (FIG. 4) discussed herein but may include additional or alternative doped material(s) within deep well 106 for further control of current flow therethrough during electrostatic discharge events. SCR 150 may include multiple doped semiconductor regions of varying polarity and concentration. SCR 150 may be particularly effective for use as a "snapback device" (i.e., a device capable of reverting to a non-conductive state from a conductive state after the electrostatic discharge event ends) due to its ease of integration into semiconductor material(s) having other structures/devices formed therein.

SCR 150 may differ from other devices 108 by including, e.g., a shallow well 152 within deep well 106. Shallow well 152 may have an opposite doping type from deep well 106, e.g., shallow well 152 may be n-type doped in the case where deep well 106 is doped p-type. Shallow well 152 may have less vertical depth than deep well 106, such that deep well 106 is located about shallow well 152 and horizontally surrounds shallow well 152. However, deep well 106 and shallow well 152 may have substantially coplanar upper surfaces. A first doped semiconductor material 154 (e.g., a first n-type semiconductor) may be coupled to first contact 114 and may be within deep well 106 without being in shallow well 152. One or more TI(s) 124, and/or other insulative materials such as nitride, may horizontally separate first doped semiconductor material 154 from shallow well 152, while maintaining a conductive pathway through deep well 106 thereunder. A second doped semiconductor material 156 (e.g., a p-type semiconductor) may be within shallow well 152, such that shallow well 152 and deep well 106 define an electrical pathway below TI(s) 124 from first doped semiconductor material 154 to second doped semiconductor material 156 through wells 106, 152. In this configuration, the pathway from first contact 114 to second contact 118 may have four regions of alternating polarity (e.g., n-p-n-p). To control current flow from first contact 114 to second contact 118, device 108 may include a gate semiconductor 158 (e.g., semiconductor having the same doping type as shallow well 152 but in a higher concentration) and a well contact 160 thereto. By applying a current to shallow well 152 through gate semiconductor 158 and well contact 160, the passage of current from first contact 114 to second contact 118 is controllable. More specifically, applying at least a trigger current ($I_{trigger}$) can enable excessive current from an electrostatic discharge event to flow through SCR 150 and hence bypass other components that are sensitive to high currents. To prevent unintended shorting through gate semiconductor 158 of SCR 150, one or more TIs 124 can be horizontally between second doped semiconductor material 156 and gate semiconductor 158, e.g., to increase the length and hence electrical resistance of the conductive pathway between second doped semiconductor material 156 and gate semiconductor 158.

Through back well(s) 130, it is possible to control $I_{trigger}$ of SCR 150 to increase or decrease its value, hence rendering it less sensitive or more sensitive to electrostatic discharge events. By electrically biasing one or more back wells 130*a*, 130*b*, the magnitude of $I_{trigger}$ can rise or fall during operation of a device with structure 100. The presence of resistive semiconductor material(s) 134*a*, 134*b* may reduce the sensitivity of SCR 150 to any biasing voltages applied to back well(s) 130*a*, 130*b*. The number of back wells 130, resistive semiconductor material(s) 134, and/or the shape of resistive semiconductor material(s) 134 can vary between implementations as discussed with respect to other implementations.

Figure 6:
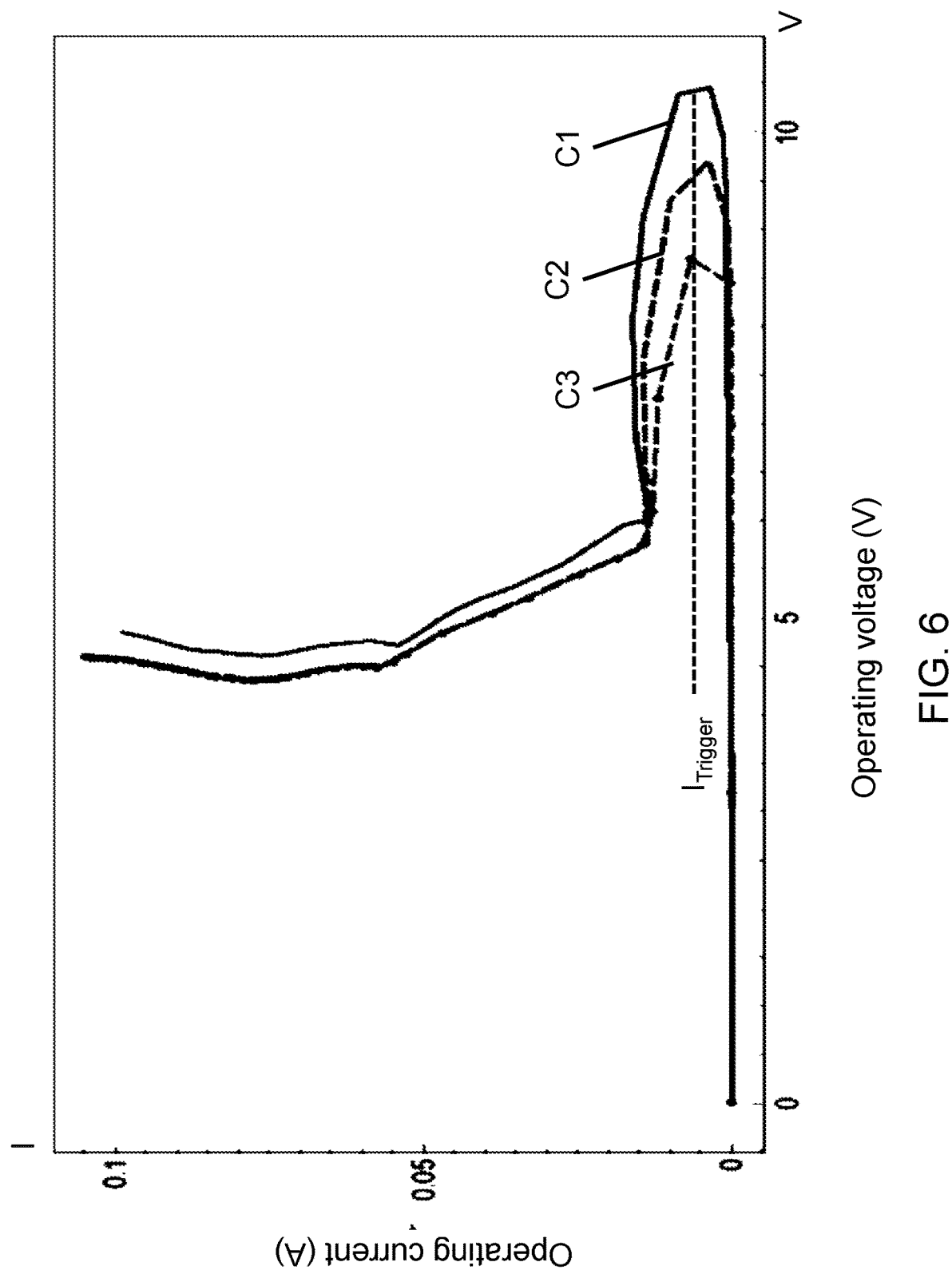
FIG. 6 depicts a comparative plot of operating current versus voltage for two devices according to embodiments of the disclosure compared with a conventional device.

Referring to FIG. 6, an example plot of current versus operating voltage in structure 100 further illustrates the effect of resistive semiconductor material(s) 134 on ESD device(s) 140 (FIG. 4) and/or SCR 150 (FIG. 5). The example plot shown illustrates how device(s) 108 may respond to increasing operating voltages and currents during an electrostatic discharge event. A first curve C1 (indicated with a solid line) depicts the behavior of structure 100 without resistive semiconductor material(s) 134 included therein, a second curve C2 (indicated with a dashed line) depicts the behavior of structure 100 with one region of resistive semiconductor material 134 included therein, and a third curve C3 (indicated with a dot-dashed line) depicts the behavior of structure 100 with multiple region of resistive semiconductor materials 134 included therein. First curve C1 may reach its triggering current ($I_{trigger}$, e.g., 0.01 amperes (A)) at a relatively high voltage (e.g., more than ten volts (V)), and hence may not allow bypassing of electrostatic discharge currents when such currents occur at a voltage of less than ten V. The device illustrated with second curve C2, by contrast, triggers at a relatively lower voltage of approximately 9.5 V, and thus is more sensitive to electrostatic discharge events. Third curve C3, in still further contrast, has multiple biasing voltages applied thereto and triggers at a voltage of approximately 8.5 V. By selectively applying a voltage to one or more back wells 130*a*, 130*b* (FIGS. 3-5) one structure 100 can exhibit behavior according to any of curves C1, C2, C3, or additional current-voltage profiles.

In addition to the various types of devices 108 discussed herein (e.g., transistor 110, ESD device 140, SCR 150), device 108 additionally or alternatively may include, e.g., bidirectional thyristors or other thyristor-based protective devices (TSPDs), gas discharge tubes (GDTs), bipolar transistors having avalanche junctions, and/or other electrical elements having similar properties.

Embodiments of the disclosure may provide various technical and commercial advantages, examples of which are discussed herein. Embodiments of the disclosure may allow resistive semiconductor region(s) 134 to be formed, e.g., by implantation and/or using conventional processing masks that are otherwise used to form back contacts to an electrically doped device. In turn, this advantage allows structures 100 to be formed to better control biasing of doped material(s) according to embodiments of the disclosure without increasing the surface area needed for biasing control. In conventional devices, reductions in biasing effect typically require additional material(s) and hence increases to doped device area by, for example, twenty percent or more, for each device.

The method and structure as described above are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher-level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a center processor.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about," "approximately," and "substantially," are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. An integrated circuit (IC) structure comprising:
a semiconductor substrate having a deep well;
a device within a first portion of the deep well, the device including:
a first doped semiconductor material coupled to a first contact;
a second doped semiconductor material coupled to a second contact, wherein the deep well couples the first doped semiconductor material to the second doped semiconductor material;
a first back well within a second portion of the deep well; and
a first resistive semiconductor material within the deep well and interposed between the first portion of the deep well and the second portion of the deep well.

2. The IC structure of claim 1, further comprising a trench isolation (TI) within the deep well and horizontally between the first back well and the device, wherein the first resistive semiconductor material is below a lower surface of the first back well and horizontally adjacent the TI.

3. The IC structure of claim 1, wherein the first resistive semiconductor material includes amorphous silicon (a-Si).

4. The IC structure of claim 1, further comprising:
a second back well within a third portion of the deep well, wherein the first portion of the deep well is horizontally between the second portion and the third portion of the deep well; and
a second resistive semiconductor material within the deep well and interposed between the first portion of the deep well and the third portion of the deep well.

5. The IC structure of claim 1, wherein the device includes a transistor including:
a source within the first doped semiconductor material,
a drain within the second doped semiconductor material, and
a gate over the first portion of the deep well, wherein the gate is horizontally between the first doped semiconductor material and the second doped semiconductor material.

6. The IC structure of claim 1, wherein the device includes an electrostatic discharge device (ESD) including:
a first n-type semiconductor within the first doped semiconductor material,
a second n-type semiconductor within the second doped semiconductor material, and
a p-type semiconductor within the first portion of the deep well, wherein the p-type semiconductor is horizontally between the first n-type semiconductor and the second n-type semiconductor.

7. The IC structure of claim 1, wherein the device includes a silicon controlled rectifier (SCR) including:
An n-type semiconductor within the first doped semiconductor material,
a shallow well within the deep well, and
a p-type semiconductor within the shallow well,
wherein the second doped semiconductor material includes a gate semiconductor within the shallow well, a trench isolation (TI) horizontally separates the gate semiconductor from the p-type semiconductor, and the first portion of the deep well is horizontally between the n-type semiconductor and the shallow well.

8. An integrated circuit (IC) structure comprising:
a semiconductor substrate having a deep well of a first doping type;
a device within a first portion of the deep well, the device including:
a first doped semiconductor material coupled to a first contact, and having a second doping type opposite the first doping type;
a second doped semiconductor material coupled to a second contact, having the second doping type, wherein the deep well couples the first doped semiconductor material to the second doped semiconductor material;
a first back well within a second portion of the deep well, and having the first doping type; and
a first resistive semiconductor material within the deep well and interposed between the first portion of the deep well and the second portion of the deep well.

9. The IC structure of claim 8, further comprising a trench isolation (TI) within the deep well and horizontally between the first back well and the device, wherein the first resistive semiconductor material is below a lower surface of the first back well and horizontally adjacent the TI.

10. The IC structure of claim 8, wherein the first resistive semiconductor material includes amorphous silicon (a-Si).

11. The IC structure of claim 8, further comprising:
a second back well within a third portion of the deep well, wherein the first portion of the deep well is horizontally between the second portion and the third portion; and
a second resistive semiconductor material within the deep well and interposed between the first portion of the deep well and the third portion of the deep well.

12. The IC structure of claim 8, wherein the device includes a transistor including:
a source within the first doped semiconductor material,
a drain within the second doped semiconductor material, and
a gate over the first portion of the deep well, wherein the gate is horizontally between the first doped semiconductor material and the second doped semiconductor material.

13. The IC structure of claim 8, wherein the device includes an electrostatic discharge device (ESD) including:
a first n-type semiconductor within the first doped semiconductor material,
a second n-type semiconductor within the second doped semiconductor material, and
a p-type semiconductor within the first portion of the deep well, wherein the p-type semiconductor is horizontally between the first n-type semiconductor and the second n-type semiconductor.

14. The IC structure of claim 8, further comprising an amorphous semiconductor (a-Si) layer within the semiconductor substrate, wherein the deep well is above the a-Si layer and a remainder of the semiconductor substrate is below the a-Si layer.

15. An integrated circuit (IC) structure comprising:
a semiconductor substrate having a deep well of a first doping type;
a shallow well within the deep well, the shallow well having a second doping type opposite the first doping type;
a device within a first portion of the deep well and within the shallow well, the device including:
a first doped semiconductor material within the first portion of the deep well, coupled to a first contact, and having the second doping type, and
a second doped semiconductor material within the shallow well, coupled to a second contact, having the first doping type, wherein the deep well couples the first doped semiconductor material to the second doped semiconductor material,
a back well within a second portion of the deep well, and having the first doping type; and
a resistive semiconductor material within the deep well and interposed between the first portion of the deep well and the second portion of the deep well.

16. The IC structure of claim 15, further comprising a trench isolation (TI) within the deep well and horizontally between the back well and the device, wherein the resistive semiconductor material is below a lower surface of the back well and horizontally adjacent the TI.

17. The IC structure of claim 16, wherein the first doped semiconductor material is adjacent the TI such that the TI is horizontally between the back well and the first doped semiconductor material.

18. The IC structure of claim 15, wherein the resistive semiconductor material includes amorphous silicon (a-Si).

19. The IC structure of claim 15, wherein the device includes a silicon controlled rectifier (SCR) including:
an n-type semiconductor within the first doped semiconductor material, a p-type semiconductor within the second doped semiconductor material, and a gate semiconductor within the shallow well, and horizontally separated from the p-type semiconductor, wherein the first portion of the deep well is horizontally between the n-type semiconductor and the shallow well.

20. The IC structure of claim 19, further comprising a trench isolation (TI) within the shallow well, and horizontally between the p-type semiconductor and the gate semiconductor.

* * * * *